United States Patent
Ichikawa

(10) Patent No.: US 7,155,643 B2
(45) Date of Patent: Dec. 26, 2006

(54) SEMICONDUCTOR INTEGRATED CIRCUIT AND TEST METHOD THEREOF

(75) Inventor: Osamu Ichikawa, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 321 days.

(21) Appl. No.: 10/804,138

(22) Filed: Mar. 19, 2004

(65) Prior Publication Data

US 2004/0205427 A1 Oct. 14, 2004

(30) Foreign Application Priority Data

Apr. 10, 2003 (JP) .............................. 2003-105990

(51) Int. Cl.
- G11C 29/44 (2006.01)
- G11C 29/00 (2006.01)
- G11C 29/12 (2006.01)

(52) U.S. Cl. .................. 714/710; 714/723; 365/201

(58) Field of Classification Search ................ 714/710, 714/711, 718, 723; 365/200–201
See application file for complete search history.

(56) References Cited

U.S. PATENT DOCUMENTS

| 5,808,947 | A | * | 9/1998 | McClure ..................... 365/201 |
| 6,421,286 | B1 | | 7/2002 | Ohtani et al. |

2002/0006065 A1 1/2002 Suzuki

FOREIGN PATENT DOCUMENTS

| JP | 200143698 | 2/2001 |
| JP | 200232998 | 1/2002 |

* cited by examiner

*Primary Examiner*—Cynthia Britt
(74) *Attorney, Agent, or Firm*—Stevens, Davis, Miller & Mosher, LLP

(57) ABSTRACT

A semiconductor integrated circuit includes a memory which has redundant lines for repair in both a column direction and a row direction. A test pattern generating section generates a specific test pattern for the memory. A comparing section reads an output from the memory to judge whether or not a fault cell exists in the memory and outputs a signal which shows existence or nonexistence of a faulty cell. The circuit includes a first data storage section, which operates in a first test mode for a test of the memory and a second test mode for a scan test, and a second data storage section which receives an output signal of the comparing section to store a state of presence or absence of a failure corresponding to the existence or nonexistence of the faulty cell. A repair judging section receives an input to the first data storage section and an output of retained contents in the first data storage section and judges that the memory is repairable. When the second data storage section is in a state where the failure exists, the first data storage section holds the data retained in the first data storage section.

11 Claims, 12 Drawing Sheets

SEMICONDUCTOR INTEGRATED CIRCUIT AND TEST METHOD THEREOF

This application claims the following foreign priority document for benefit of filing date per 35 USC 119: Japanese Application. No. 2003-105990 filed Apr. 10, 2003.

BACKGROUND OF THE INVENTION

1. Field of the Invention

The present invention relates to a semiconductor integrated circuit capable of testing a memory, in particular testing a memory having a redundant cell and testing a peripheral logic of the memory, using a Built In Self Test (BIST), and a test method thereof.

2. Description of the Prior Art

Recently, the number and the scale of the memories (bit width and the number of words), which have been mounted in a semiconductor integrated circuit (LSI), have been increased. According to this, the number of external pins and the test time which are needed for inspecting the memory mounted in the LSI using a circuit tester from the outside increase.

In contrast to this, importance of a BIST (Built In Self Test, hereinafter referred to as BIST) technology for executing the test of the memory within the LSI has been increased. By using the BIST technology, while being able to inspect the memory using fewer external pins, it becomes possible to simultaneously inspect a plurality of memories within the LSI because of fewer pins being used.

Moreover, there is a case of using a redundant repair method wherein a redundant circuit (word line for repair, bit line for repair, including cell for repair) has been provided beforehand, and a bit line or a word line, in which a memory cell which becomes faulty due to a defect exists, is replaced with the word line for repair or the bit line for repair, so that the faulty cell is repaired. Thereby, the yield of the memory can be improved.

FIG. 12 shows an example of a repair for the memory and a test circuit of a peripheral logic of the memory using a former BIST.

A test pattern generating section 1201 generates a test pattern for a memory 1204, and a comparing section 1202 compares whether output data of the memory 1204 matches with an expected value, judges whether the output data matches with the expected value, and outputs the result to a FAIL terminal.

Information on an address and a bit location of a faulty cell detected by the comparing section 1202 is retained in a repair process section 1203. The information on the stored faulty cell is used to identify a repair word line and a repair bit line which should be repaired.

Moreover, a signal which has branched from an input to the memory 1204 is retrieved into a flip-flop 1205 for observation, and an output of the memory 1204 is controlled using a flip-flop 1206 for control via a selector 1207, so that a scan test for a BIST circuit itself and a peripheral logic of the memory 1204 is carried out.

Thus, in a circuit in which repair processes for the memory using the former BIST are performed, in order to calculate an address which should be repaired, the repair process section has a memory element therein for storing information on a faulty address and a faulty bit, which have been detected as Fail during the test using the BIST, and in order to perform a scan test for the BIST circuit itself and a memory periphery, a flip-flop for observing an input signal into the memory is provided.

As described above, in order to achieve the repair processes for the memory using the BIST, the memory element for storing the information on the faulty address of the memory is required, and in addition, in order to perform the scan test for the BIST circuit itself and the peripheral logic of the memory, the flip-flop for observation for observing the input signal into the memory and the flip-flop for control for controlling an output of memory are required.

Therefore, in order to achieve the repair processes for the memory and the scan test for the BIST, the memory element for repair process and the flip-flop for scan test are needed, so that there has been a problem that the circuit area has been increased.

SUMMARY OF THE INVENTION

The present invention is made so as to solve above problems, and the object thereof is to provide a semiconductor integrated circuit which can suppress an increase in circuit area for redundant repair and circuit area for scan test, and a test method thereof.

A semiconductor integrated circuit according to the present invention comprises:

a memory, which has a set of redundant lines for repair in a Column direction;

a test pattern generating section, which generates a specific test pattern for said memory;

a comparing section, which reads an output from said memory to judge whether a faulty cell exists in said memory or not, and outputs a signal showing the existence or nonexistence of said faulty cell, and including a pass/fail judgment signal for every bit;

a first data storage section, which during a test of said memory, retrieves a signal which has branched from all or a part of Column address signals which are inputted into said memory from said test pattern generating section, and the pass/fail judgment signal for every said bit generated by said comparing section as faulty address data, and during a test of a peripheral logic of said memory, forms a part of a scan chain, and is used for observing an input signal into said memory;

a second data storage section, which receives an output signal of said comparing section to store a state of the presence or absence of a failure corresponding to the existence or nonexistence of said faulty cell; and a repair judging section, which receives an input to said first data storage section and an output of retained contents in said first data storage section, and judges that said memory is repairable, wherein when said second data storage section is in a state where said failure exists, said first data storage section holds the data retained in said first data storage section.

According to the configuration described above, in the redundant repair circuit of the memory using the BIST, the data storage section, which retrieves the signal which has branched from the signal inputted into the memory from the BIST, is prepared, the data storage section is used as a memory element (flip-flop) for storing the faulty address during the test of the memory, and the flip-flop in the data storage section is used as a part of the scan chain during the test of the BIST circuit itself and the peripheral logic of the memory, and thereby it becomes possible to suppress an increase in circuit area which is needed for the scan test for the logic portion and the test of the memory.

Another semiconductor integrated circuit according to the present invention comprises:

a memory, which has a set of redundant lines for repair in a Column direction;

a test pattern generating section, which generates a specific test pattern for said memory;

a comparing section, which reads an output from said memory to judge whether a faulty cell exists in said memory or not, and outputs a signal showing the existence or nonexistence of said faulty cell, and including a pass/fail judgment signal for every bit;

a first data storage section, which during a test of said memory, retrieves a signal which has branched from all or a part of Column address signals which are inputted into said memory from said test pattern generating section, and the pass/fail judgment signal for every said bit generated by said comparing section as faulty address data, and during a test of a peripheral logic of said memory, forms a part of a scan chain, and is used for observing an input signal into said memory; and a repair judging section, which receives an input to said first data storage section and an output of retained contents in said first data storage section, and judges that said memory is repairable, wherein said first data storage section receives a FAIL signal which is outputted from said comparing section, and when a faulty cell exists in said memory, becomes active to maintain in an active state until the test is completed, and when said FAIL signal is active, holds the data retained in said first data storage section.

According to the configuration described above, the first data storage section has a selector which can selectively retrieve the data input signal inputted into the memory from the test pattern generating section, or the pass/fail judgment signal for every bit.

According to the configuration described above, when receiving a judgment of a failure with a plurality of bit faults as the pass/fail judgment signal for every bit generated by the comparing section, the repair judging section judges that the memory is not repairable.

Another semiconductor integrated circuit according to the present invention comprises:

a memory, which has a pair of redundant lines for repair in a Row direction;

a test pattern generating section, which generates a specific test pattern for said memory;

a comparing section, which reads an output from said memory to judge whether a faulty cell exists in said memory or not, and outputs a signal which shows the existence or nonexistence of said faulty cell;

a first data storage section, which during a test of said memory, retrieves all Row address signals or a signal which has branched a part of bits therefrom inputted into said memory from said test pattern generating section as faulty address data, and during a test of a peripheral logic of said memory, is used for observing the input signal into said memory as a part of the scan chain;

a second data storage section, which receives an output signal of said comparing section to store a state of the presence or absence of a failure corresponding to the existence or nonexistence of said faulty cell; and a repair judging section, which receives the input to said first data storage section, and an output of retained contents in said first data storage section, and judges that said memory is repairable, wherein when said second data storage section is in a state where said failure exists, said first data storage section holds the data retained in said first data storage section.

Another semiconductor integrated circuit according to the present invention comprises:

a memory, which has a pair of redundant lines for repair in a Row direction;

a test pattern generating section, which generates a specific test pattern for said memory;

a comparing section, which reads an output from said memory to judge whether a faulty cell exists in said memory or not, and outputs a signal which shows the existence or nonexistence of said faulty cell;

a first data storage section, which during a test of said memory, retrieves all Row address signals or a signal which has branched a part of bits therefrom inputted into said memory from said test pattern generating section as faulty address data, and during a test of a peripheral logic of said memory, is used for observing the input signal into said memory as a part of the scan chain; and a repair judging section, which receives an input to said first data storage section and an output of retained contents in said first data storage section, and judges that said memory is repairable, wherein said first data storage section receives a FAIL signal which is outputted from said comparing section, and when a faulty cell exists in said memory, becomes active and maintains in an active state until the test is completed, and when said FAIL signal is active, holds the data retained in said first data storage section.

Another semiconductor integrated circuit according to the present invention comprises:

a memory, which has redundant lines for repair in the Column direction and in the Row direction;

a test pattern generating section, which generates a specific test pattern for said memory;

a comparing section, which reads an output from said memory to judge whether a fault cell exists in said memory or not, and outputs a signal which shows the existence or nonexistence of said faulty cell;

a first data storage section, which during a test of said memory, retrieves a signal which has been branched from an address signal inputted into said memory from said test pattern generating section, and an output signal from said comparing section as faulty address data, and during a test of a peripheral logic of said memory, is used for observing the input signal into said memory as a part of the scan chain;

a second data storage section, which receives an output signal of said comparing section to store a state of the presence or absence of a failure corresponding to the existence or nonexistence of said faulty cell; and a repair judging section, which receives an input to said first data storage section and an output of retained contents in said first data storage section, and judges that said memory is repairable, wherein when said second data storage section is in a state where said failure exists, said first data storage section holds the data retained in said first data storage section.

According to the configuration described above, when a MONITOR signal which becomes active only when a faulty cell exists in said memory, and a FAIL signal which becomes active when a faulty cell exists in said memory and maintains in an active state until the test is completed, which are the signals outputted from said comparing section, are active, said repair judging section compares the input of said first data storage section and the output of said first data storage section to judge whether said memory is repairable or not.

A test method of a semiconductor integrated circuit of the present invention characterized in that it is a test method of the semiconductor integrated circuit configured as described above; and the first data storage section is used for retaining fault information on the memory when inspecting the memory, and is used for observing an input signal into the memory when inspecting the peripheral logic of the memory.

PREFERRED EMBODIMENTS (First Embodiment)

Figure 1:
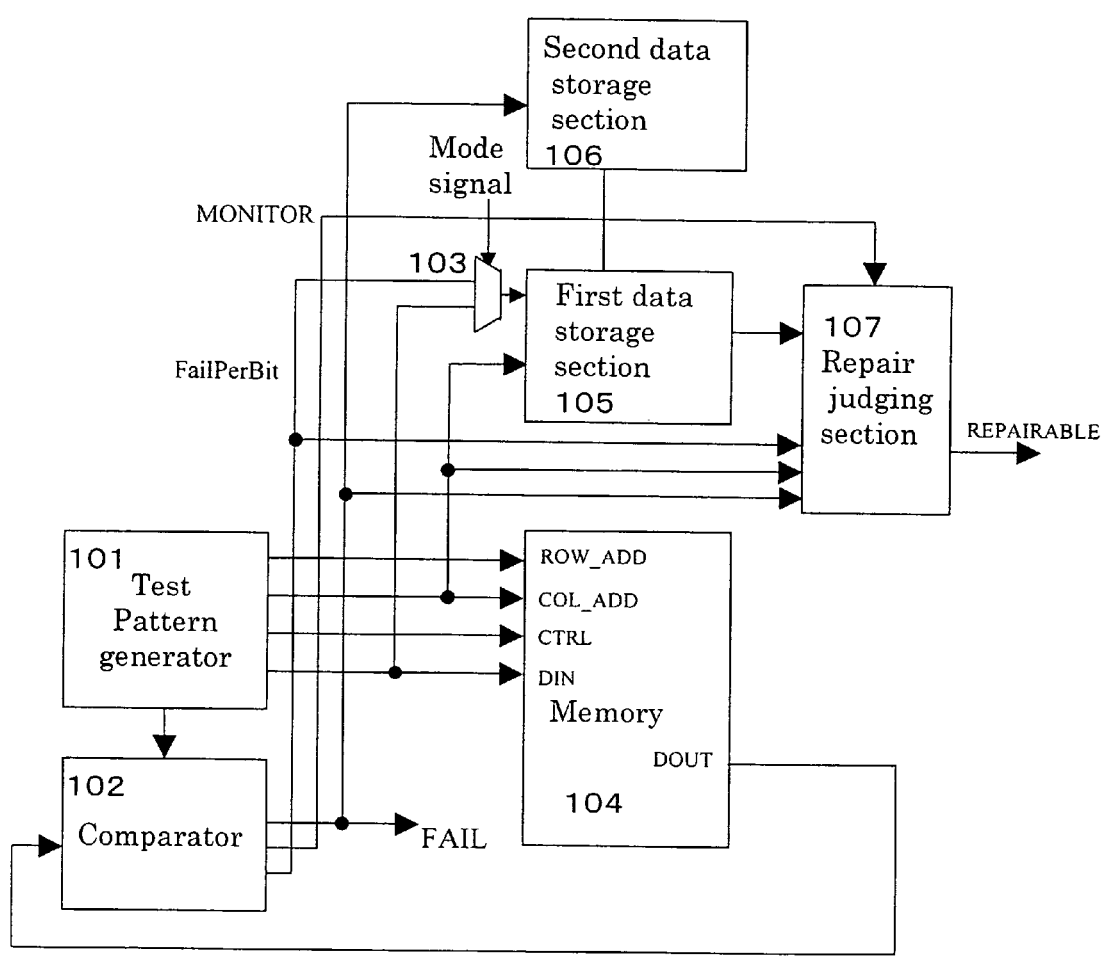
FIG. 1 is a block diagram for describing a semiconductor integrated circuit according to a first embodiment of the present invention.

FIG. 1 is a block diagram for describing a semiconductor integrated circuit according to a first embodiment of the present invention.

A memory 104 represents a memory to be tested, which has a set of redundant lines for repair in a Column direction, and in the embodiment, includes a single Column line for repair which is replaced by the repair processes therein.

Symbol 101 represents a test pattern generating section, which generates a Row address signal ROW_ADD, a Column address signal COL_ADD, a control signal CTRL, and a data input signal DIN, and inputs them into the memory 104.

Symbol 102 represents a comparing section, which compares an output response DOUT of the memory 104 with respect to the test pattern inputted into the memory 104 with a value expected when the memory is normal (expected value), and detects a faulty cell which does not normally store the signal. The comparing section 102 generates a FAIL signal which becomes active once a faulty cell is detected and maintains in an active state until the test is completed, and a MONITOR signal which becomes active only when a failure is detected and does not become active when a failure is not detected, and a FailPerBit (bit fail) signal which compares the output data DOUT of the memory 104 for every bit with the expected value, wherein only a bit in which a failure exists becomes active.

Symbol 106 represents a second data storage section, which retains a state value of the presence or absence of a failure in the memory 104 during carrying out the test by receiving the FAIL signal from the comparing section 102 (a value which shows a state until a first failure is detected from the test start, and a value which shows a state after detecting the first failure).

In order to perform the repair for the memory 104 in the Column direction, information on a Column address and its bit location of a cell with fault is needed for identifying a Column line with fault. Symbol 105 represents a first data storage section, which during the test of the memory 104, retrieves all or a part of signals which are branched from the Column address signal inputted into the memory 104 from the test pattern generating section 101, and a pass/fail judgment signal for every bit generated by the comparing section 102 as faulty address data. That is, when performing the repair processes for the memory 104, the information on the Column address and its bit location of the cell with fault is stored, the information on the Column address and its bit location of a cell with faulty cell which has been detected first is stored, and then its value is retained in the first data storage section 105. In order to retain the data, the value retained in the second data storage section 106 is used. If the second data storage section 106 has a value showing a state after detecting the first failure, the value stored in the first data storage section 105 is kept retaining.

Moreover, when performing the scan test for the peripheral logic of the memory 104, the first data storage section 105 configures a part of the scan chain and is used for observing the failure which is transmitted to the memory 104, so that the failure detection of the peripheral logic of the memory 104 can be improved.

Symbol 103 represents a selector, which selects the data input signal DIN generated by the test pattern generating section 101, or the FailPerBit signal generated by the comparing section 102, inputs the information on the bit location of the cell with fault into the first data storage section 105 by selecting the FailPerBit signal when performing the repair processes for the memory 104, and selects either the data input signal DIN to the memory 104 or the FailPerBit signal when performing the scan test for the peripheral logic of the memory, so that the failure which is transmitted to the memory 104 is observed by the first data storage section 105.

Symbol 107 represents a repair judging section, which compares a signal inputted into the first data storage section 105 with the value currently retained in the first data storage section 105 when both of the FAIL signal and the MONITOR signal are active, and judges that the memory 104 is repairable using the Column line for repair when they are the same, but judges that it is not repairable when they are different. Moreover, when a plurality of bits among the FailPerBit (s) inputted into the repair judging section 107 are active, it also judges that the memory is not repairable.

Figure 2:
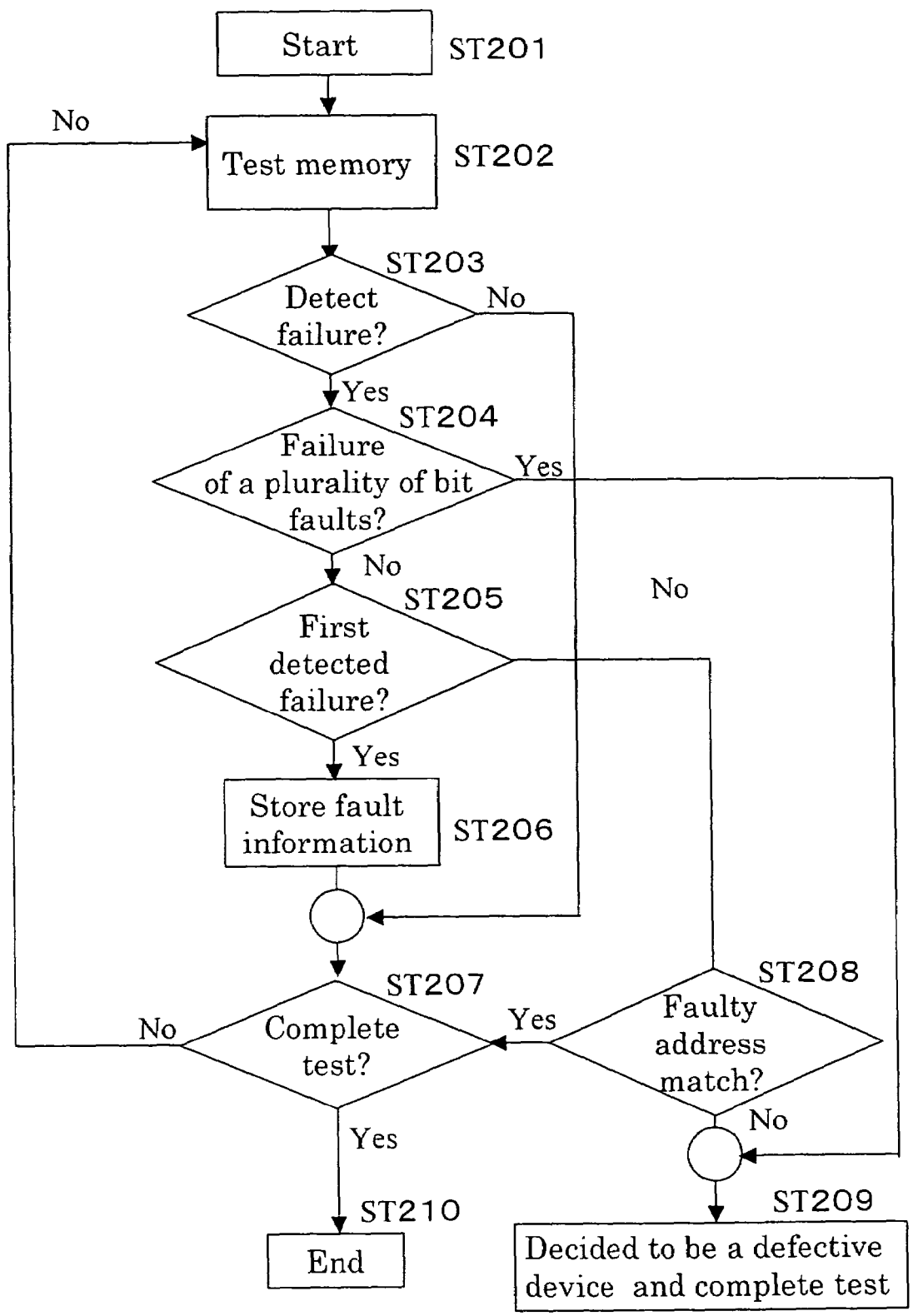
FIG. 2 is a flow chart for describing the first embodiment.

FIG. 2 is a flow chart showing repair process operations for the memory in a semiconductor integrated circuit shown in FIG. 1.

Figure 3:
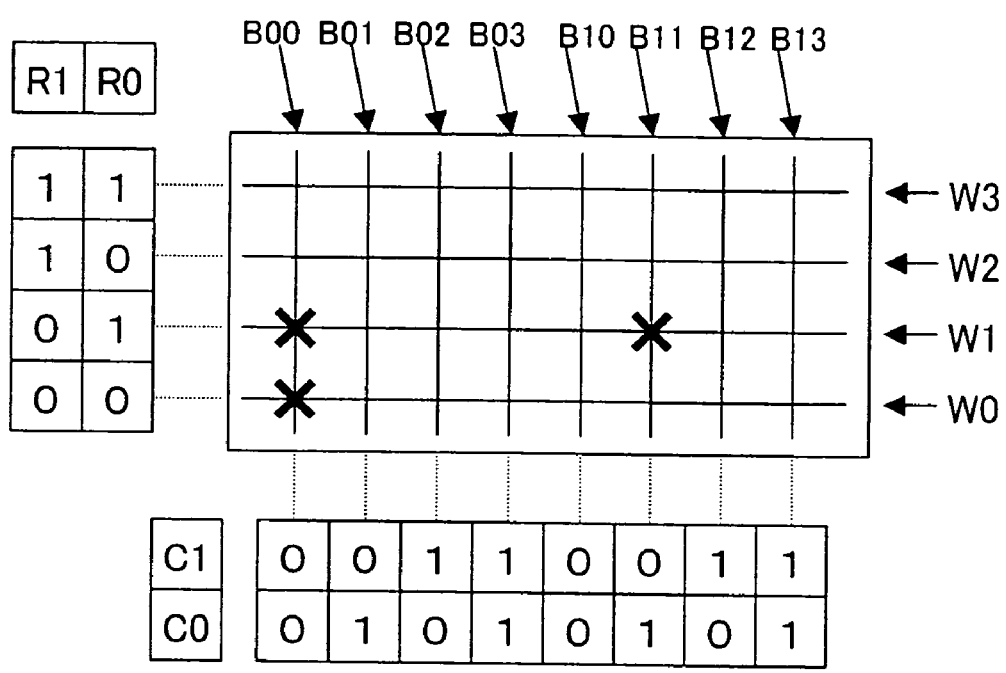
FIG. 3 is an explanatory diagram showing a fault distribution in a memory according to the first embodiment.

Hereafter, referring to FIG. 1, FIG. 2, and FIG. 3, the description is made of achieving the repair processes for the memory.

In FIG. 3, R1 and R0 show a Row address with 2-bits of the memory 104, and the Row address is shown by (R1, R0). R1 is the msb (most significant bit) and R0 is the lsb (least significant bit). C1 and C0 show a Column address with 2-bits of the memory 104, and the Column address is shown by (C1, C0)

C1 is the msb and C0 is the lsb.
W0 is a word line to Row address (R1, R0)=(0, 0),
W1 is a word line to Row address (R1, R0)=(0, 1),
W2 is a word line to Row address (R1, R0)=(1, 0),
W3 is a word line to Row address (R1, R0)=(1, 1),
B00 is a bit line to a 0th bit of Column address (C1, C0)=(0, 0),
B01 is a bit line to the 0th bit of Column address (C1, C0)=(0, 1),
B02 is a bit line to the 0th bit of Column address (C1, C0)=(1, 0),
B03 is a bit line to the 0th bit of Column address (C1, C0)=(1, 1),
B10 is a bit line to a first bit of Column address (C1, C0)=(0, 0),
B11 is a bit line to the first bit of Column address (C1, C0)=(0, 1),
B12 is a bit line to the first bit of Column address (C1, C0)=(1, 0),
B13 is a bit line to the first bit of Column address (C1, C0)=(1, 1), and a memory cell is arranged at a point of intersection of a bit line and a word line.

A memory cell with fault is represented by "x" in its drawing, there exist three faulty cells in
the 0th bit of an address shown by Row address (R1, R0)=00, Column address (C1, C0)=00,
the 0th bit of an address shown by Row address (R1, R0)=01, Column address (C1, C0)=00, and
the first bit of an address shown by Row address (R1, R0)=01, Column address (C1, C0)=01, and it is shown that two memory cells on the W1 and two memory cells on the B00 are faulty.

The test is started at step ST201. In terms of a count direction of the address when testing, the description is made of a case where the Column address is counted first.

A first detected failure is in the 0th bit of the address shown by Row address (R1, R0)=00, Column address (C1, C0)=00, a second detected failure is in the 0th bit of the address shown by Row address (R1, R0)=01, Column address (C1, C0)=00, and a third (last) detected failure is the first bit of the address shown by Row address (R1, R0)=01, Column address (C1, C0)=01.

At step ST202, the test pattern is inputted into the memory 104 from the test pattern generating section 101, and the comparing section 102 compares the output from the memory 104 with the expected value.

At step ST203, a failure is detected at Row address (R1, R0)=00, Column address (C1, C0)=00. Since the failure is detected, the step moves to step ST204. At step ST204, it is judged whether it is a failure with a plurality of bit faults or not. At the address in question, since the failure exists in the 0th bit, the step moves to step ST205. Since the failure in question is the first detected failure, the step moves to step ST206.

Here, while a value showing that there has been a failure is retained in the second data storage section 106 for the first time, a value of (C1, C0)=00 as the Column address, and a value showing that there has existed a failure only in the 0th bit as the FailPerBit are retained in the first data storage section 105 as a faulty address. Next, although the step moves to step ST207, since the test has not been completed yet, the step returns to step ST202.

Next, although the address of the failure detected at step ST203 is at Row address (R1, R0)=01, Column address (C1, C0)=00, since the failure to this address is also only in the 0th bit, and it is not a failure with a plurality of bit faults, the step moves to step ST205. When a failure with a plurality of bit faults is detected, since the failure with a plurality of bit faults must exist on the different bit lines, so it becomes not to be repairable in the repair using the single Column line, the step moves to step ST209 and it is decided to be a defective device, and then the process is completed.

Since this second detected failure is not the first detected failure, the step moves to step ST208. Since the value currently retained in the second data storage section 106 is the value showing the state after detecting the first failure, the Column address of the second detected failure and the value of FailPerBit are not retrieved into the first data storage section 105, but the Column address and the value of FailPerBit of the first detected failure are still kept retaining therein.

At step ST208, at the time when the failure is detected at the second time, since the MONITOR signal becomes active and the FAIL signal has been kept in an active state after the first failure has been detected, the repair judging section 107 judges whether or not the faulty address of the first detected failure retained in the first data storage section 105 matches with the faulty address of the second detected failure. In this case, since both the first detected failure and the second detected failure are at the same address (both are on B00 line), it is judged that the faulty addresses are matched, and the step moves to step ST207.

At step ST207, since the test has not been completed yet, the step moves to step ST202.

Although an address of a failure detected next (at a third time) is at Row address (R1, R0)=01, Column address (C1, C0)=01, since the failure to this address is also only in the first bit and is not a failure with a plurality of bit faults, the step moves to step ST205.

Since the third detected failure is not the first detected failure, either the step moves to step ST208. Since the value currently retained in the second data storage section 106 is the value showing the state after detecting the first failure, the Column address of the third detected failure and the value of FailPerBit are not retrieved into the first data storage section 105, but the Column address and the value of FailPerBit of the first detected failure are still kept retaining therein.

At step ST208, at the time when the failure is detected at the third time, since the MONITOR signal becomes active and the FAIL signal has been kept in an active state after detecting the first failure, the repair judging section 107 judges whether or not the faulty address of the first detected failure retained in the first data storage section 105 matches with the faulty address of the third detected failure. In this case, since the first detected failure is on B00 line, and the third detected failure is on B11 line, the first detected failure and the third detected failure are not the same address and the repair judging section 107 judges it not to be repairable, and the step moving to step ST209, it is decided to be a defective device because of not being repairable, and then the process is completed.

According to the first embodiment as described above, in the redundant repair circuit of the memory 104 using the BIST, the data storage section, which retrieves the signal which has been branched from the signal inputted into the memory 104 from the BIST, is prepared, the data storage section is used as a memory element (flip-flop) used for storing the faulty address during the test of the memory 104, and the flip-flop in the data storage section is used as a part of the scan chain during the test of the BIST circuit itself and the peripheral logic of the memory, and thereby it becomes possible to suppress an increase in circuit area which is needed for the scan test for the logic portion and the test of the memory.

Figure 5:
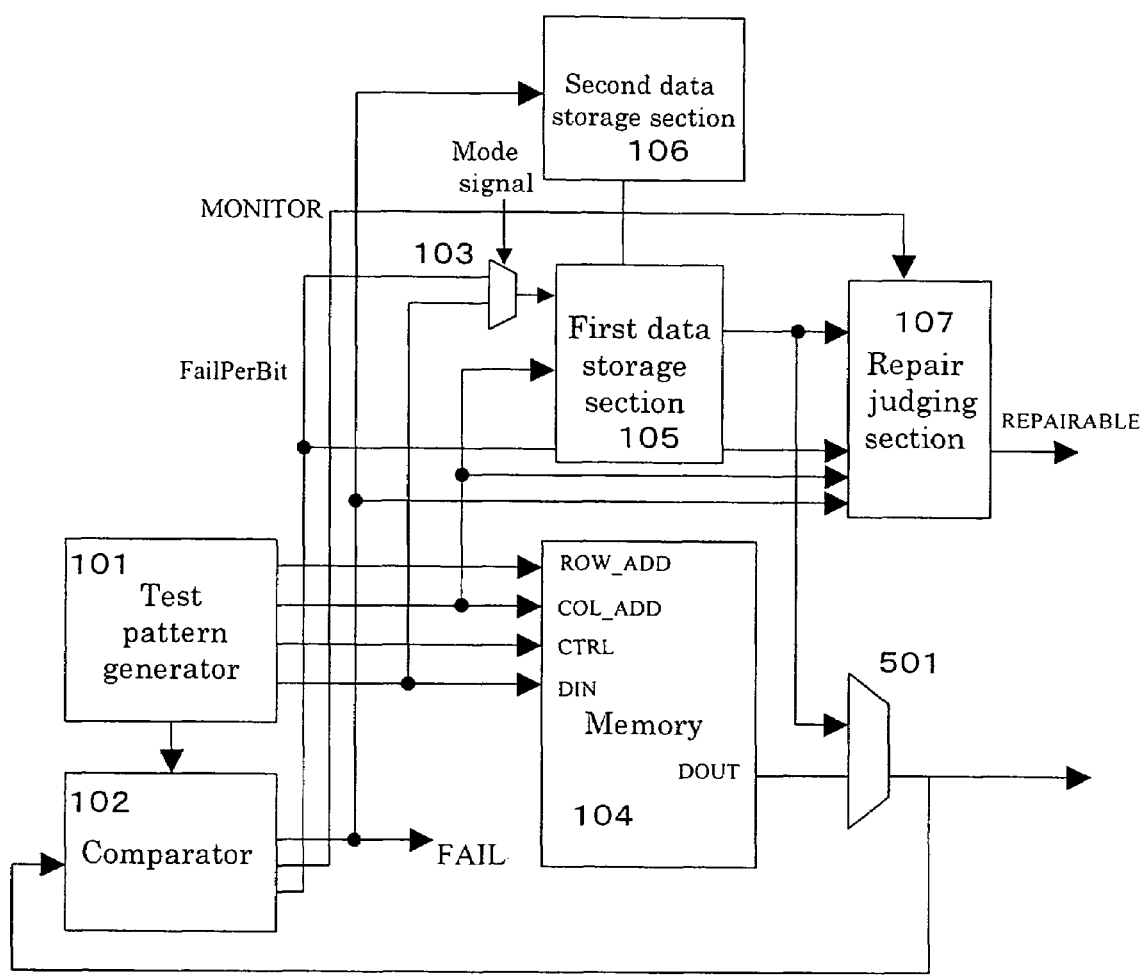
FIG. 5 is a block diagram for describing a semiconductor integrated circuit according to a modified form of the first embodiment.

Incidentally, in this embodiment, the description is made of an example where the first data storage section 105 is used for observing the input signal into the memory 104, but in addition, as shown in FIG. 5, the output of the first data storage section 105 and the output signal DOUT of the memory 104 are selectively retrieved by a selector 103, and the value of the output signal DOUT of the memory 104 is also used for control using the output of the first data storage section 105 during the scan test, so that the output of the memory can be controlled, and thereby it becomes possible to further improve the failure detection of the memory periphery, and the similar effect as this embodiment can be obtained.

Moreover, if the line for repair for the memory is one line in the Column direction, the Column address which is the faulty address of the faulty cell detected first, and the pass/fail judgment signal for every bit are retrieved into the first data storage section 105, the value of the faulty address of the faulty cell detected first which has been retrieved into the first data storage section 105 is held by the value retained in the second data storage section 106, in which the data as to whether or not there has been a fault in the memory 104 is retained, and the faulty address of the faulty cell detected after the second time is compared with the faulty address retrieved into the first data storage section 105, so that the repair propriety judgment of the memory can be performed.

Figure 4:
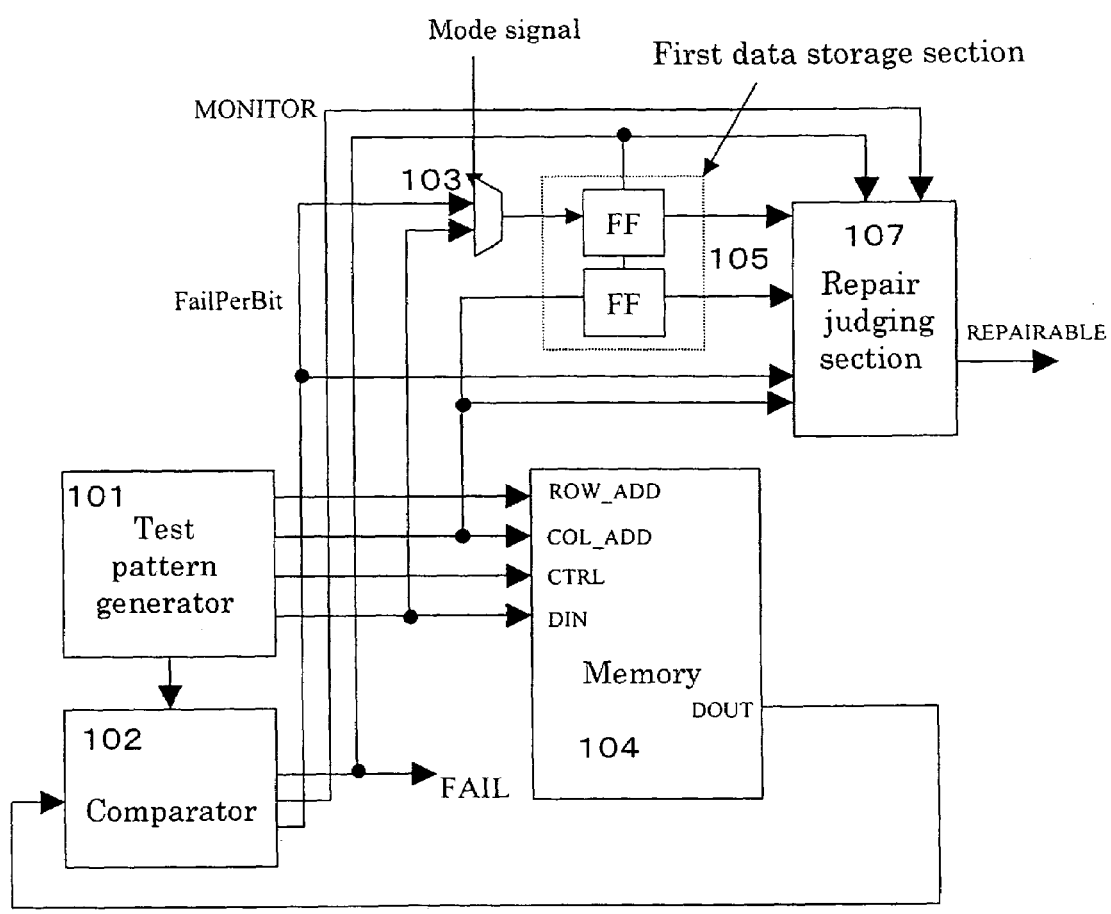
FIG. 4 is a block diagram for describing a semiconductor integrated circuit according to a modified form of the first embodiment.

Incidentally, in this embodiment, although the value of the second data storage section 106 is used in order to hold the value of the first data storage section 105, even when the value of the FAIL signal is used instead of the second data storage section 106 as shown in FIG. 4, the similar effect to this embodiment can be obtained.

Moreover, in this embodiment, although the minimum unit which is repaired in the Column direction is described as one bit line, even when the minimum unit which is repaired in the Column direction is a plurality of bit lines, the similar effect to this embodiment can be obtained by collectively treating the plurality of bit lines which are the minimum unit for being repaired as the faulty address.

(Second embodiment)

Figure 6:
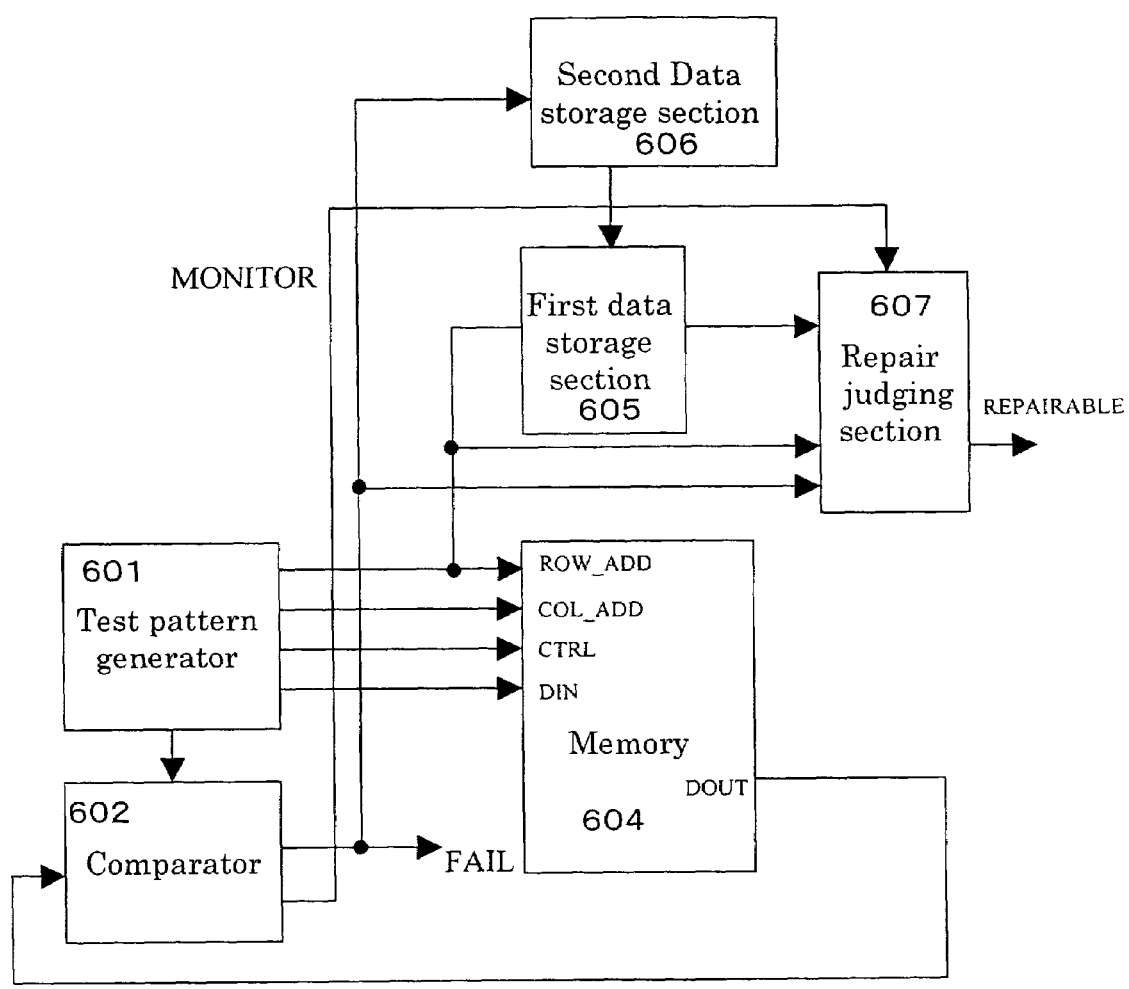
FIG. 6 is a block diagram for describing a semiconductor integrated circuit according to a second embodiment.

FIG. 6 is a block diagram for describing a semiconductor integrated circuit according to a second embodiment of the present invention.

A memory 604 represents a memory to be tested, which has a set of redundant lines for repair in the Row direction, and in the embodiment, includes a single Row line for repair which is replaced by the repair processes therein.

Symbol 601 represents a test pattern generating section, which generates a Row address signal ROW_ADD, a Column address signal COL_ADD, a control signal CTRL, and a data input signal DIN, and inputs them into the memory 604.

Symbol 602 represents a comparing section, which compares an output response DOUT of the memory 604 with respect to the test pattern inputted into the memory 604 with a value expected when the memory is normal (expected value), and detects a faulty cell which does not normally store the signal. The comparing section 602 generates a FAIL signal which becomes active once a faulty cell is detected and maintains in an active state until the test is completed, a MONITOR signal which becomes active only when a failure is detected and does not become active when a failure is not detected, and a FailPerBit signal which compares the output data DOUT of the memory 604 for every bit with the expected value, wherein only a bit in which a failure exists becomes active.

Symbol 606 represents a second data storage section, which retains a state value of the presence or absence of a failure in the memory 604 during carrying out the test by receiving the FAIL signal from the comparing section 602 (a value which shows a state until a first failure is detected from the test start, and a value which shows a state after detecting the first failure).

In order to perform the repair for the memory 604 in the Row direction, information on a Row address of a cell with fault is needed for identifying a Row line with fault. Symbol 605 represents a first data storage section, which during a test of the memory 604, retrieves all Row address signals or a signal, in which a part of bits has branched therefrom, inputted into the memory 604 from the test pattern generating section 601 as the faulty address data. That is, when performing the repair processes for the memory 604, the Row address of the cell with fault is stored, a Row address of a faulty cell detected first is stored, and the value is retained in the first data storage section 605 after that. In order to hold the data stored in the first data storage section 605, the value retained in the second data storage section 606 is used. If the second data storage section 606 has a value showing a state after detecting the first failure, the value stored in the first data storage section 605 is kept retaining. Moreover, when performing the scan test for the peripheral logic of the memory 604, the first data storage section 605 configures a part of the scan chain and is used for observing the failure which is transmitted to the memory 604, so that the failure detection of the peripheral logic of the memory 604 can be improved.

Symbol 607 represents a repair judging section, which compares a signal inputted into the first data storage section 605 with the value currently retained in the first data storage section 605 when both the FAIL signal and the MONITOR signal are active, and judges that the memory 604 is repairable using the Row line for repair when they are the same, but judges that it is not repairable when they are different.

Figure 7:
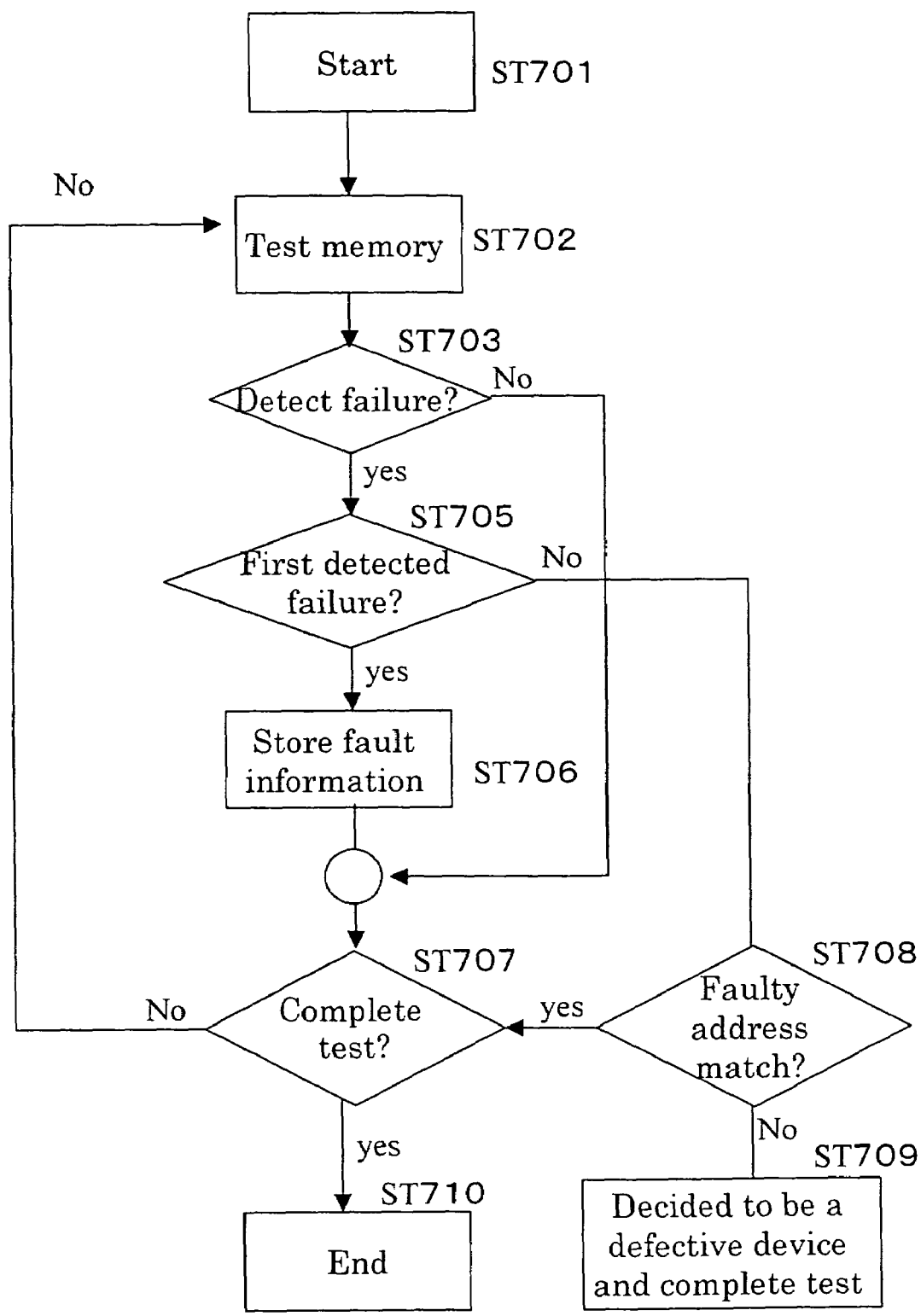
FIG. 7 is a flow chart for describing the second embodiment.

FIG. 7 is a flow chart showing repair process operations for the memory in the semiconductor integrated circuit shown in FIG. 6.

Figure 8:
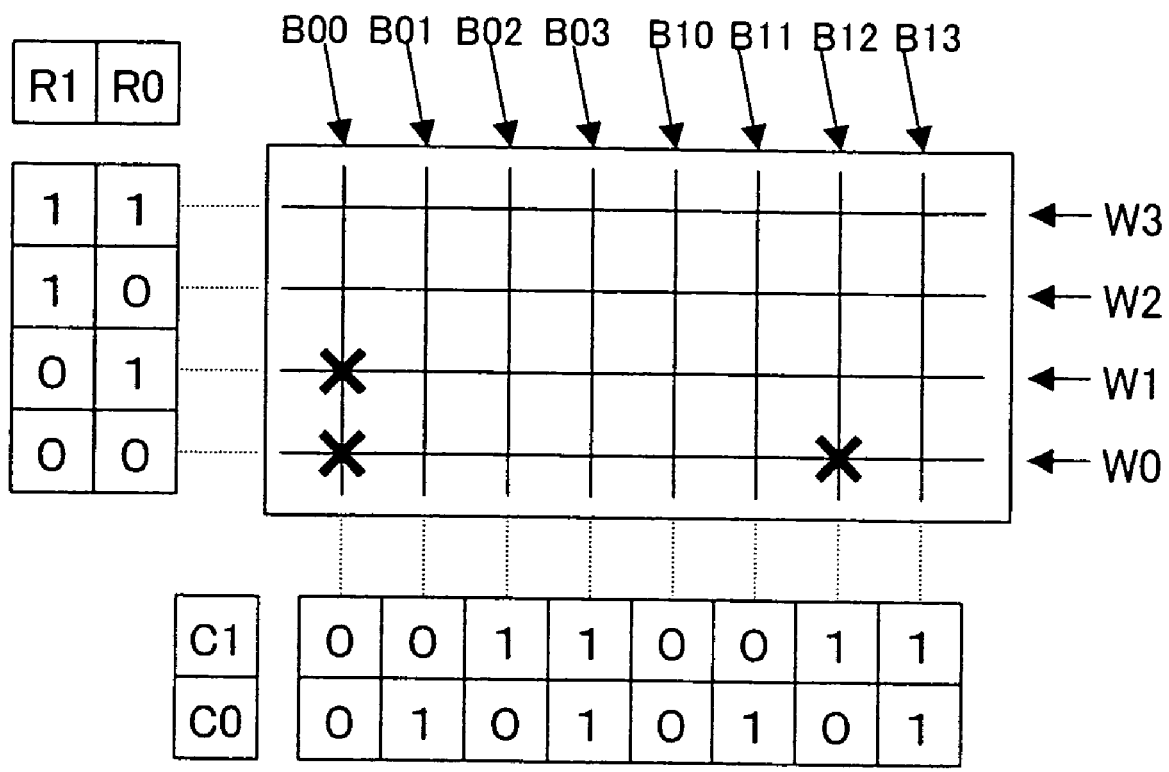
FIG. 8 is an explanatory diagram showing a fault distribution in a memory according to the second embodiment.

Hereafter, referring to FIG. 6, FIG. 7, and FIG. 8, the description is made of achieving the repair processes for the memory.

In FIG. 8, R1 and R0 show a Row address with 2-bits of the memory 604, and the Row address is shown by (R1, R0). R1 is the msb and R0 is the lsb.

C1 and C0 show a Column address with 2-bits of the memory 604, and the Column address is shown by (C1, C0). C1 is the msb and C0 is the lsb.

W0 is a word line to Row address (R1, R0)=(0, 0),
W1 is a word line to Row address (R1, R0)=(0, 1),
W2 is a word line to Row address (R1, R0)=(1, 0),
W3 is a word line to Row address (R1, R0)=(1, 1),
B00 is a bit line to a 0th bit of Column address (C1, C0)=(0, 0),
B01 is a bit line to the 0th bit of Column address (C1, C0)=(0, 1), B02 is a bit line to the 0th bit of Column address (C1, C0)=(1, 0),
B03 is a bit line to the 0th bit of Column address (C1, C0)=(1, 1),
B10 is a bit line to a first bit of Column address (C1, C0)=(0, 0),
B11 is a bit line to the first bit of Column address (C1, C0)=(0, 1),
B12 is a bit line to the first bit of Column address (C1, C0)=(1, 0),
B13 is a bit line to the first bit of Column address (C1, C0)=(1, 1), and a memory cell is arranged at a point of intersection of a bit line and a word line.

A memory cell with fault is represented by "x" in its drawing, and there exist three faulty cells in
the 0th bit of an address shown by Row address (R1, R0)=00, Column address (C1, C0)=00,
the first bit of an address shown by Row address (R1, R0)=00, Column address (C1, C0)=10, and
the 0th bit of an address shown by Row address (R1, R0)=01, Column address (C1, C0)=00, and
it is shown that two memory cells on the W0 and two memory cells on the B00 are faulty.

The test is started at step ST701. In terms of a count direction of the address when testing, the description is made of a case where the Column address is counted first.

A first detected failure is in the 0th bit of the address shown by Row address (R1, R0)=00, Column address (C1, C0)=00, a second detected failure is in the first bit of the address shown by Row address (R1, R0)=00, Column address (C1, C0)=10, and a third (last) detected failure is in the 0th bit of the address shown by Row address (R1, R0)=01, Column address (C1, C0)=00.

At step ST702, the test pattern is inputted into the memory 604 from the test pattern generating section 601, and the comparing section 602 compares the output from the memory 604 with the expected value.

At step ST703, a failure is detected at Row address (R1, R0)=00, Column address (C1, C0)=00. Since the failure is detected, the step moves to step ST705. Since the failure in question is the first detected failure, the step moves to step ST706.

Here, while a value showing that there has been a failure is retained in the second data storage section 606 for the first time, a value of Row address (R1, R0)=00 is retained in the first data storage section 605 as the faulty address. Next, although the step moves to step ST707, since the test has not been completed yet, the step returns to step ST702.

Next, an address of a failure detected at step ST703 is at Row address (R1, R0)=00, Column address (C1, C0)=10, and the step moves to step ST705. Since this second detected failure is not the first detected failure, the step moves to step ST708. Since the value currently retained in the second data storage section 606 is the value showing the state after detecting the first failure, the value of the Row address of the second detected failure is not retrieved into the first data storage section 605, but the value of the Row address of the first detected failure is still kept retaining therein.

At step ST708, at the time when the failure is detected at the second time, since the MONITOR signal becomes active and the FAIL signal has been kept in an active state after the first failure has been detected, the repair judging section 607 judges whether or not the faulty address of the first detected failure retained in the first data storage section 605 matches with the faulty address of the second detected failure. In this case, since both of the first detected failure and the second detected failure are at the same address (both are on W0 line), it is judged that the faulty addresses are matched, and the step moves to step ST707.

At step ST707, since the test has not been completed yet, the step moves to step ST702.

An address of a failure detected next (at a third time) is at Row address (R1, R0)=01, Column address (C1, C0)=00, and the step moves to step ST705. Since the third detected failure is not the first detected failure, either, the step moves to step ST708. Since the value currently retained in the second data storage section 606 is the value showing the state after detecting the first failure, the value of the Row address of the third detected failure is not retrieved into the first data storage section 605, but the value of the Row address of the first detected failure is still kept retaining therein.

At step ST708, at the time when the failure is detected at the third time, since the MONITOR signal becomes active and the FAIL signal has been kept in an active state after the first failure has been detected, the repair judging section 607 judges whether or not the faulty address of the first detected failure retained in the first data storage section 605 matches with the faulty address of the third detected failure. In this case, since the first detected failure is on W0 line, and the third detected failure is on W1 line, the first detected failure and the third detected failure are not the same address and the repair judging section 607 judges that it is not repairable, and the step moving to step ST709, it is decided to be a defective device because of not being repairable, and then the process is completed.

According to the second embodiment as described above, in the redundant repair circuit of the memory 604 using the BIST, the data storage section, which retrieves the signal which has been branched from the signal inputted into the memory 604 from the BIST, is prepared, the data storage section is used as a memory element (flip-flop) used for storing the faulty address during the test of the memory 604, and the flip-flop in the data storage section is used as a part of the scan chain during the test of the BIST circuit itself and the peripheral logic of the memory; and thereby it becomes possible to suppress an increase in circuit area which is needed for the scan test for the logic portion and the test of the memory 604.

Moreover, if the line for repair for the memory 604 is one line in the Row direction, only the Row address which is the faulty address of the faulty cell detected first is retrieved into the first data storage section 605, the value of the faulty address of the first detected faulty cell which has been retrieved into the first data storage section 605 is held by the value retained in the second data storage section 606, in which the data as to whether or not there has been a fault in the memory 604 is retained, and the faulty address of the faulty cell detected after the second time is compared with the faulty address retrieved into the first data storage section 605, so that the repair propriety judgment of the memory 604 can be performed.

Figure 9:
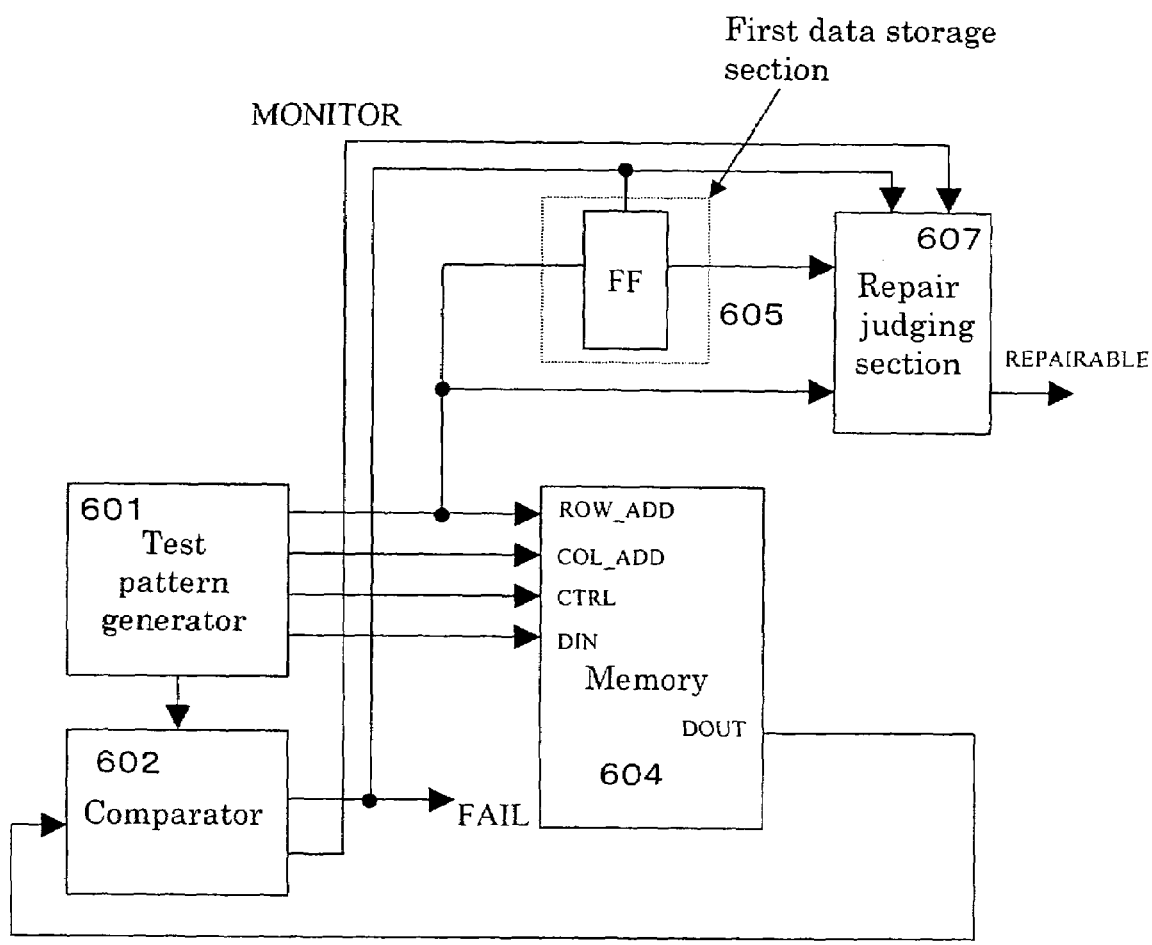
FIG. 9 is a block diagram for describing a semiconductor integrated circuit according to a modified form of the second embodiment.

Incidentally, in this embodiment, although the value of the second data storage section 606 is used in order to hold the value of the first data storage section 605, even when the value of the FAIL signal is used instead of the second data storage section as shown in FIG. 9, the similar effect to this embodiment can be obtained.

Although the minimum unit which is repaired in the Row direction is described as one word line, even when the minimum unit which is repaired in the Row direction is a plurality of word lines, the similar effect to this embodiment can be obtained by collectively treating the plurality of word lines which are the minimum unit for being repaired as the faulty address.

(Third Embodiment)

Figure 10:
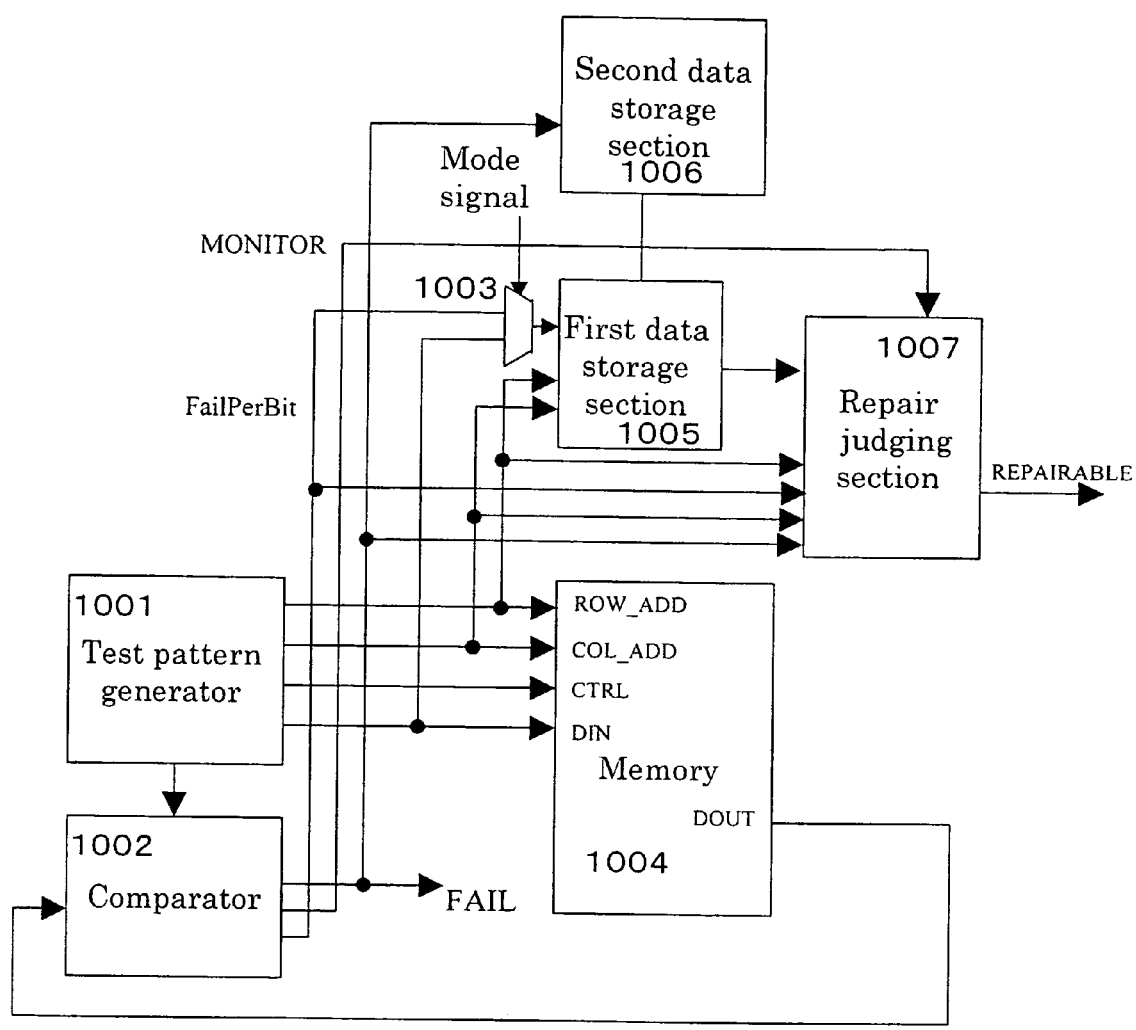
FIG. 10 is a block diagram of a semiconductor integrated circuit according to a third embodiment.

FIG. 10 is a block diagram for describing a semiconductor integrated circuit according to a third embodiment of the present invention.

A memory 1004 represents a memory to be tested, which has redundant lines for repair in a Column direction and a Row direction, and in the embodiment, includes a single Column line for repair and a single Row line for repair which are replaced by the repair processes therein.

Symbol 1001 represents a test pattern generating section, which generates a Row address signal ROW_ADD, a Column address signal COL_ADD, a control signal CTRL, and a data input signal DIN, and inputs them into the memory 1004.

Symbol 1002 represents a comparing section, which compares an output response DOUT of the memory 1004 with respect to the test pattern inputted into the memory 1004 with a value expected when the memory is normal (expected value), and detects a faulty cell which does not normally store the signal. The comparing section 1002 generates a FAIL signal which becomes active once a faulty cell is detected and maintains in an active state until the test is completed, a MONITOR signal which becomes active only when a failure is detected and does not become active when a failure is not detected, and a FailPerBit signal which compares the output data DOUT of the memory 1004 for every bit with the expected value, wherein only a bit in which a failure exists becomes active.

In order to perform the repair for the memory 1004 in the Column direction and the Row direction, information on a Column address and its bit location of a cell with fault, and on a Row address are needed for identifying a Column line with fault and a Row line with fault. Symbol 1005 represents a first data storage section, which during a test of the memory 1004, retrieves a signal which has branched from address signals inputted into the memory 1004 from the test pattern generating section 1001, and an output signal from the comparing section 1002 as the faulty address data. That is, when performing the repair processes for the memory 1004, the information on the Column address and its bit location of the cell with fault, and that on the Row address are stored.

Symbol 1006 represents a second data storage section, which retains a value showing whether or not the value which is stored in the first data storage section 1005 is the address of the faulty cell of the memory 1004. A value within the first data storage section 1005 is retained by a value retained in the second data storage section 1006.

Moreover, when performing the scan test for the peripheral logic of the memory 1004, the first data storage section 1005 configures a part of the scan chain and is used for observing the failure which is transmitted to the memory 1004, so that the failure detection of the peripheral logic of the memory 1004 can be improved.

Symbol 1003 represents a selector, which selects the data input signal DIN generated by the test pattern generating section 1001, or the FailPerBit signal generated by the comparing section 1002, inputs the information on the bit location of the cell with fault into the first data storage section 1005 by selecting the FailPerBit signal when performing the repair processes for the memory 1004, and selects either the data input signal DIN to the memory 1004 or the FailPerBit signal when performing the scan test for the peripheral logic of the memory, so that the failure which is transmitted to the memory 1004 is observed by the first data storage section 1005.

Symbol 1007 represents a repair judging section, which compares a signal inputted into the first data storage section 1005 with the value currently retained in the first data storage section 1105 when both the FAIL signal and the MONITOR signal are active, and judges whether or not it is repairable using a line for repair which is retained in the memory 1004.

Figure 11:
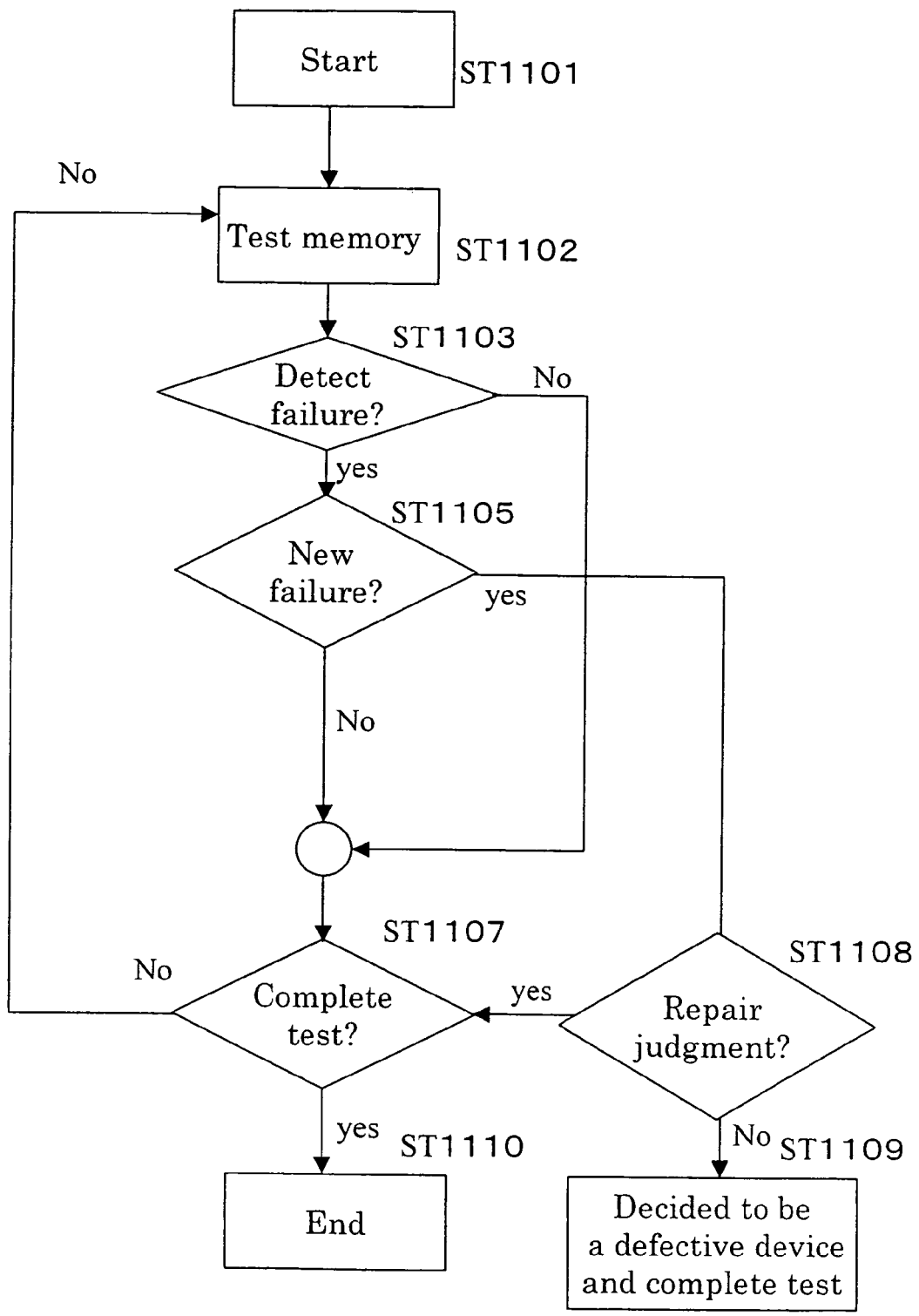
FIG. 11 is a flow chart for describing the third embodiment.
Figure 12:
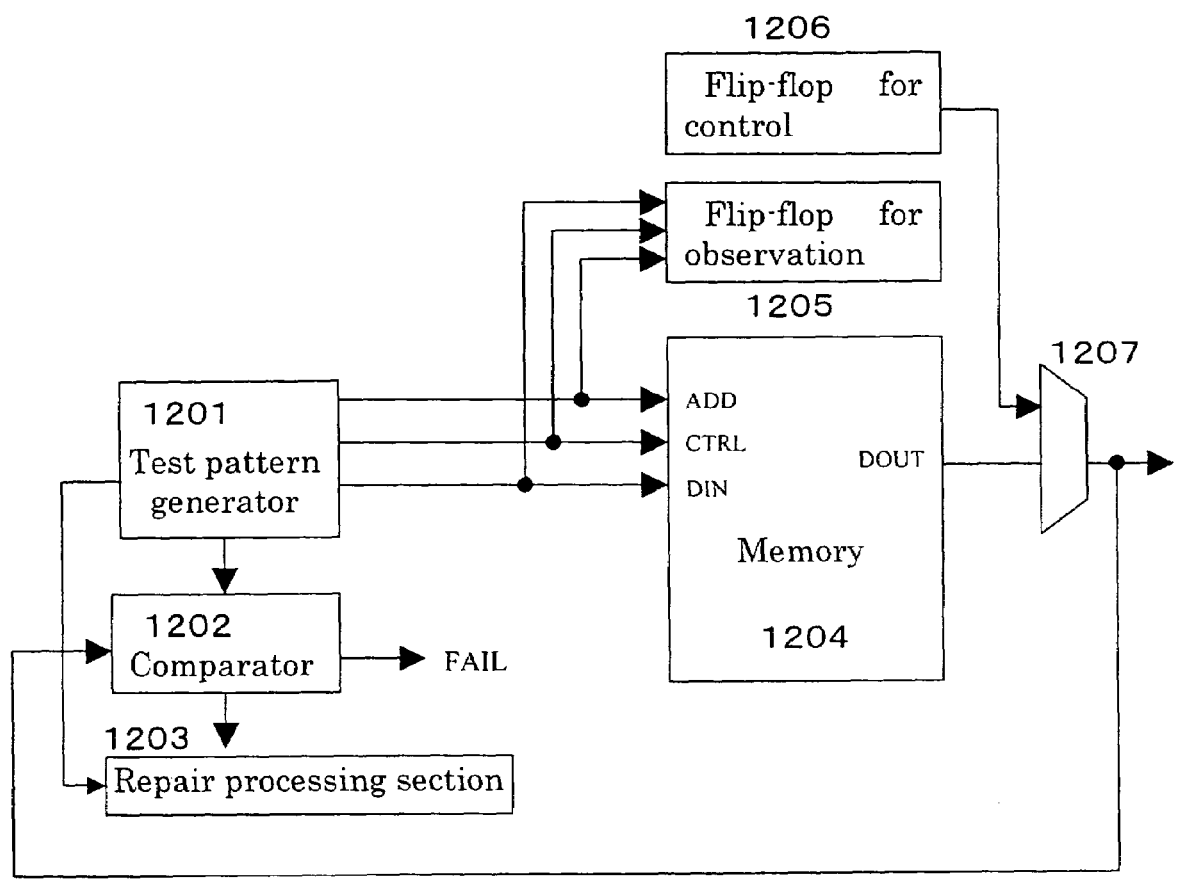
FIG. 12 is an example of a repair circuit according to a former BIST.

FIG. 11 is a flow chart showing repair process operations for the memory in a semiconductor integrated circuit shown in FIG. 10.

Hereafter, referring to FIG. 10, FIG. 11, and FIG. 3, the description is made of achieving the repair processes for the memory using FIG. 3 as an example of a distribution of faulty cells of the memory 1004. The discussion about FIG. 3 will not be repeated.

The test is started at step ST1101. The description is made of a case where the Column address is counted first in terms of a count direction of the address when testing, and the repair for the Column line is given higher priority in terms of a repair judgment between the Row line and the Column line.

A first detected failure is in the 0th bit of the address shown by Row address (R1, R0)=00, Column address (C1, C0)=00, a second detected failure is in the 0th bit of the address shown by Row address (R1, R0)=01, Column address (C1, C0)=00, and a third (last) detected failure is in the first bit of the address shown by Row address (R1, R0)=01, Column address (C1, C0)=01.

At step ST1102, the test pattern is inputted into the memory 1004 from the test pattern generating section 1001, and the comparing section 1002 compares the output from the memory 1004 with the expected value.

At step ST1103, a failure is detected at Row address (R1, R0)=00, Column address (C1, C0)=00. Since the failure is detected, the step moves to step ST1105. At step ST1105, it is judged whether the address, at which the failure has been detected, is the value retained in the first data storage section 1005 until now or not. Since the failure in question is the first detected failure, the step moves to step ST1108.

Since the priority is given to the repair for the Column line, a value of (C1, C0)=00 as the Column address, and a value showing that there has existed a failure only in the 0th bit as the FailPerBit are retained in the first data storage section 105 as a faulty address, and the value retained in the first data storage section 1005 is retained in the second data storage section 1006 as the value showing that it is a failure of the memory 1004. Next, although the step moves to step ST1107, since the test has not been completed yet, the step returns to step ST1102.

Next, at step ST1103, a failure in the 0th bit of Row address (R1, R0)=01, Column address (C1, C0)=00 is detected as a second failure, and the step moves to step ST1105. Since the priority is given to the repair for the Column line, it is judged whether the Column address and the bit of the second failure are the same as those of the failure at the first time or not. In this case, since the first failure and the second failure are at the same Column address (C1, C0)=00, and in the 0th bit being the same bit, the Column address of the second detected failure and the value of FailPerBit are not retrieved into the first data storage section 1005, but the faulty address detected first is still kept therein.

Next, the step moves to step ST1107. since the test has not been completed yet, the step returns to step ST1102.

An address of a failure detected next (at a third time) is in the first bit at Row address (R1, R0)=01, Column address (C1, C0)=01. Since the Column address and the bit location thereof are different from the value currently retained in the first data storage section 1005, it is judged as a new failure. Since the repair line in the Column direction has already been used, the value of (R1, R0)=01 as the Row address is retained as the faulty address in the first data storage section 1005 using the repair line in the Row direction, and the value retained in the first data storage section 1005 is retained in the second data storage section 1006 as the value showing that it is a failure of the memory 1004.

Since it is in a state to be repairable with one repair line in the Row direction and one repair line in the Column direction, at step ST1108, it is judged to be repairable and the step moves to step ST1107, but since the test has not been completed yet, the step returns to step ST1102.

After that, since a failure does not exist, it is judged that the test is completed at step ST1107 when all addresses have been tested. In this case, since the memory is repairable with one repair line in the Row direction and one repair line in the Column direction, the process is completed at step ST1110 being judged to be repairable.

According to the third embodiment as described above, in the redundant repair circuit of the memory using the BIST, the data storage section, which retrieves the signal which has been branched from the signal inputted into the memory from the BIST, is prepared, the data storage section is used as a memory element (flip-flop) used for storing the faulty address during the test of the memory 1004, and the flip-flop in the data storage section is used as a part of the scan chain during the test of the BIST circuit itself and the peripheral logic of the memory; and thereby it becomes possible to suppress an increase in circuit area which is needed for the scan test for the logic portion and the test of the memory.

Moreover, in this embodiment, although the description is made of a case where there are one repair line in the Row direction and one repair line in the Column line, even when there are a plurality of lines for repair, by retaining the value which is stored in the first data storage section, and a value for judging whether its value is a faulty cell, in the second data storage section, it can be judged whether or not the value stored in the first data storage section is the address of the faulty cell; and thereby the similar effect to this embodiment can be obtained.

What is claimed is:

1. A semiconductor integrated circuit, comprising:
   a memory which has a set of redundant lines for repair in a column direction;
   a test pattern generating section which generates a specific test pattern for said memory;
   a comparing section which reads an output from said memory to judge whether or not a faulty cell exists in said memory and outputs a signal showing the existence or nonexistence of said faulty cell and including a pass/fail judgment signal for every bit;
   a first data storage section which, in a first test mode for a test of said memory, retrieves a signal which has branched from all or a part of column address signals which are inputted into said memory from said test pattern generating section and the pass/fail judgment signal for said every bit generated by said comparing section as faulty address data, and which during a test of peripheral logic of said memory, forms a part of a scan chain and is used for observing an input signal into said memory and which, in a second test mode for a scan test, configures a part of the scan chain and is used for observing the failure which is transmitted to the memory;
   a second data storage section which receives an output signal of said comparing section to store a state of presence or absence of a failure corresponding to the existence or nonexistence of said faulty cell; and
   a repair judging section which receives an input to said first data storage section and an output of retained contents in said first data storage section and judges that said memory is repairable, wherein:
   when said second data storage section is in a state where said failure exists, said first data storage section holds the data retained in said first data storage section.

2. The semiconductor integrated circuit according to claim 1, wherein said first data storage section includes a selector which is operable to selectively retrieve a data input signal inputted into said memory from said test pattern generating section or a pass/fail judgment signal for said every bit.

3. The semiconductor integrated circuit according to claim 1, wherein said repair judging section judges that said memory is not repairable in response to receiving a judgment of a failure with a plurality of bit faults as the pass/fail judgment signal for said every bit generated by said comparing section.

4. A semiconductor integrated circuit, comprising:
   a memory, which has a set of redundant lines for repair in a column direction;
   a test pattern generating section which generates a specific test pattern for said memory;
   a comparing section which reads an output from said memory to judge whether or not a faulty cell exists in said memory and outputs a signal showing existence or nonexistence of said faulty cell and including a pass/fail judgment signal for every bit;
   a first data storage section which, in a first test mode for a test of said memory, retrieves a signal which has branched from all or a part of column address signals which are inputted into said memory from said test pattern generating section and the pass/fail judgment signal for every said bit generated by said comparing section as faulty address data, and which, during a test of peripheral logic of said memory, forms a part of a scan chain and is used for observing an input signal into said memory and which, in a second test mode for a scan test, configures a part of the scan chain and is used for observing the failure which is transmitted to the memory; and
   a repair judging section which receives an input to said first data storage section and an output of retained contents in said first data storage section and judges that said memory is repairable, wherein:
   said first data storage section receives a FAIL signal which is outputted from said comparing section, and when a faulty cell exists in said memory, becomes active and maintains in an active state until the test is completed, and when said FAIL signal is active, holds the data retained in said first data storage section.

5. The semiconductor integrated circuit according to claim 4, wherein said first data storage section includes a selector which is operable to selectively retrieve a data input signal inputted into said memory from said test pattern generating section or a pass/fail judgment signal for said every bit.

6. The semiconductor integrated circuit according to claim 4, wherein when receiving a judgment of a failure with a plurality of bit faults as the pass/fail judgment signal for every bit generated by said comparing section, said repair judging section judges that said memory is not repairable.

7. A semiconductor integrated circuit, comprising:
a memory which has a pair of redundant lines for repair in a row direction;
a test pattern generating section which generates a specific test pattern for said memory;
a comparing section which reads an output from said memory to judge whether or not a fault cell exists in said memory and outputs a signal which shows the existence or nonexistence of said faulty cell;
a first data storage section which, in a first test mode for a test of said memory, retrieves all row address signals or a signal which has branched a part of bits therefrom inputted into said memory from said test pattern generating section as faulty address data, and which, during a test of peripheral logic of said memory, is used for observing the input signal into said memory as a part of the scan chain and which, in a second test mode for a scan test, configures a part of the scan chain and is used for observing the failure which is transmitted to the memory;
a second data storage section which receives an output signal of said comparing section to store a state of presence or absence of a failure corresponding to the existence or nonexistence of said faulty cell; and
a repair judging section which receives an input to said first data storage section and an output of retained contents in said first data storage section and judges that said memory is repairable, wherein:
when said second data storage section is in a state where said failure exists, said first data storage section holds the data retained in said first data storage section.

8. A semiconductor integrated, circuit, comprising:
a memory which has a pair of redundant lines for repair in a row direction;
a test pattern generating section which generates a specific test pattern for said memory;
a comparing section which reads an output from said memory to judge whether or not a fault cell exists in said memory and outputs a signal which shows existence or nonexistence of said faulty cell;
a first data storage section which, in a first test mode for a test of said memory, retrieves all row address signals or a signal which has branched a part of bits therefrom inputted into said memory from said test pattern generating section as faulty address data, and which, during a test of peripheral logic of said memory, is used for observing the input signal into said memory as a part of the scan chain and which, in a second test mode for a scan test, configures a part of the scan chain and is used for observing the failure which is transmitted to the memory;
a repair judging section which receives an input to said first data storage section and an output of retained contents in said first data storage section and judges that said memory is repairable, wherein:
said first data storage section receives a FAIL signal which is outputted from said comparing section, and when a faulty cell exists in said memory, becomes active and maintains in an active state until the test is completed, and when said FAIL signal is active, holds the data retained in said first data storage section.

9. A semiconductor integrated circuit, comprising:
a memory which has redundant lines for repair in a column direction and a row direction,
a test pattern generating section which generates a specific test pattern for said memory;
a comparing section which reads an output from said memory to judge whether or not a fault cell exists in said memory and outputs a signal which shows existence or nonexistence of said faulty cell;
a first data storage section which, in a first test mode for a test of said memory, retrieves a signal which has been branched from an address signal inputted into said memory from said test pattern generating section and an output signal from said comparing section as faulty address data, and which, during a test of a peripheral logic of said memory, is used for observing the input signal into said memory as a part of the scan chain and which, in a second test mode for a scan test, configures a part of the scan chain and is used for observing the failure which is transmitted to the memory;
a second data storage section which receives an output signal of said comparing section to store a state of presence or absence of a failure corresponding to the existence or nonexistence of said faulty cell; and
a repair judging section which receives an input to said first data storage section and an output of retained contents in said first data storage section and judges that said memory is repairable, wherein:
when said second data storage section is in a state where said failure exists, said first data storage section holds the data retained in said first data storage section.

10. The semiconductor integrated circuit according to any one of claims 1–9, wherein when (i) a MONITOR signal, which is a signal that is outputted from said comparing section and becomes active only when a faulty cell exists in said memory, and (ii) a FAIL signal, which becomes active when a faulty cell exists in said memory and keeps an active state until the test is completed, are active, said repair judging section compares an input of said first data storage section with an output of said first data storage section to judges whether or not said memory is repairable.

11. A test method of the semiconductor integrated circuit according to any one of claims 1–9, comprising using the first data storage section to retain fault information on the memory when inspecting the memory, and using the first data storage section to observe an input signal into the memory when inspecting the peripheral logic of the memory.

* * * * *